US012597889B2

(12) United States Patent
Visser

(10) Patent No.: US 12,597,889 B2
(45) Date of Patent: Apr. 7, 2026

(54) DISTORTION COMPENSATION FOR A SWITCH IN AN AMPLIFIER CIRCUIT

(71) Applicant: NXP B.V., Eindhoven (NL)

(72) Inventor: Robert Melis Visser, Nootdorp (NL)

(73) Assignee: NXP B.V., Eindhoven (NL)

( * ) Notice: Subject to any disclaimer, the term of this patent is extended or adjusted under 35 U.S.C. 154(b) by 397 days.

(21) Appl. No.: 18/325,555

(22) Filed: May 30, 2023

(65) Prior Publication Data

US 2024/0405728 A1     Dec. 5, 2024

(51) Int. Cl.
| | |
|---|---|
| *H03G 3/30* | (2006.01) |
| *H03F 1/02* | (2006.01) |
| *H03F 1/32* | (2006.01) |
| *H03F 3/16* | (2006.01) |
| *H03F 1/30* | (2006.01) |

(52) U.S. Cl.
CPC ............. *H03F 1/3205* (2013.01); *H03F 3/16* (2013.01); *H03G 3/30* (2013.01); *H03F 1/303* (2013.01); *H03G 2201/103* (2013.01)

(58) Field of Classification Search
CPC .... H03F 1/3205; H03F 3/16; H03F 2200/144; H03F 2200/156; H03F 2200/213; H03F 3/195; H03F 1/086; H03F 1/32; H03F 1/14; H03F 3/72; H03F 1/0277; H03F 1/02; H03F 3/45475; H03F 1/303; H03F 3/005; H03G 3/30; H03G 2201/103; H03G 1/0088; H03G 1/0094; H03G 3/001; H03G 3/008; H03G 1/0023; H03G 3/3042; H03K 19/017545
USPC .............................................. 330/9, 51, 278
See application file for complete search history.

(56) References Cited

U.S. PATENT DOCUMENTS

| | | | | |
|---|---|---|---|---|
| 9,941,849 B1 * | 4/2018 | Ayranci | .................. | H03F 3/195 |
| 11,705,873 B2 * | 7/2023 | Sanner | ...................... | H03F 1/56 |
| | | | | 330/277 |
| 2015/0344360 A1 | 12/2015 | Tanaka | | |
| 2016/0344360 A1 | 11/2016 | Kropfitsch et al. | | |
| 2023/0179156 A1 * | 6/2023 | Chen | ...................... | H03F 3/195 |
| | | | | 330/252 |

OTHER PUBLICATIONS

Khatavkar, P., "432 nW per Channel 130 nV/rtHz ECG Acquisition Front End With Multifrequency Chopping", IEEE Transactions on Very Large Scale Integration (VLSI) Systems, vol. 27, No. 9, Sep. 2019.

* cited by examiner

*Primary Examiner* — Khanh V Nguyen

(57)     ABSTRACT

An amplifier circuit that includes a capacitor voltage divider that is selectively enabled with a switch. The circuit includes two capacitor banks where the banks are electrically coupled to opposing side terminals of the switch. When the capacitor voltage divider is not enabled, one bank is adjusted to control the gain of the amplifier. When the capacitor voltage divider is enabled, both banks are used to control the gain of the amplifier.

20 Claims, 6 Drawing Sheets

DISTORTION COMPENSATION FOR A SWITCH IN AN AMPLIFIER CIRCUIT

BACKGROUND OF THE INVENTION

Field of the Invention

This invention relates to distortion compensation for a switch in an amplifier circuit.

Background

Amplifiers are used to increase or adjust the amplitude of a signal for further processing. Some amplifier circuits include a selectively enabled capacitor voltage divider used in adjusting the gain of the amplifier.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein is an amplifier circuit that includes a capacitor voltage divider that is selectively enabled with a switch. The circuit includes two capacitor banks where the banks are electrically coupled to opposing side terminals of the switch. When the capacitor voltage divider is not enabled, one bank is adjusted to control the gain of the amplifier. When the capacitor voltage divider is enabled, both banks are used to control the gain of the amplifier.

In some embodiments, utilizing programmable capacitor banks coupled to opposing switch terminals of a switch for controlling the gain of an amplifier may provide for an amplifier circuit where voltage distortions due to nonlinearities of the switch at the opposing switch terminals can be compensated for to reduce the voltage distortions.

Figure 1:
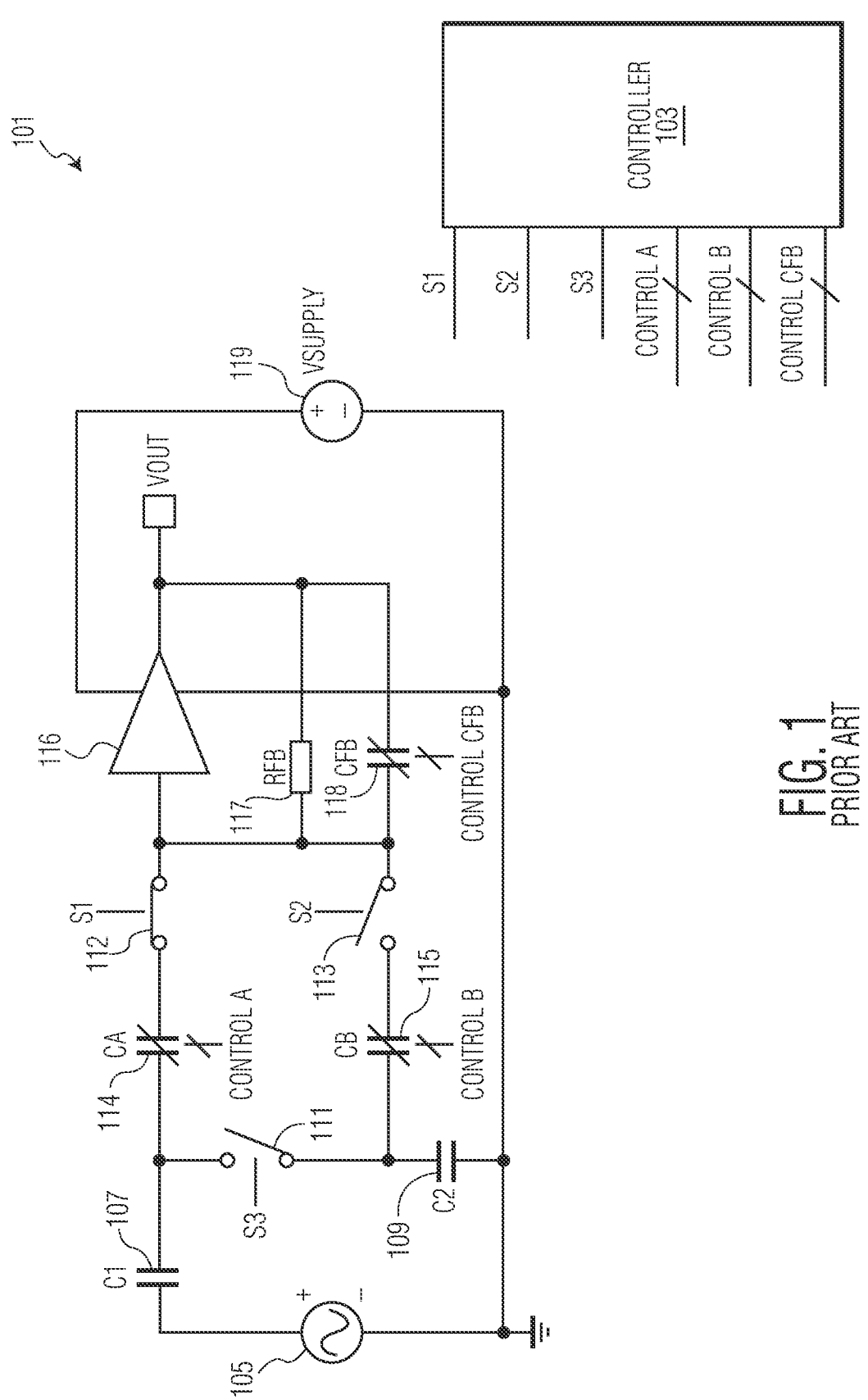
FIG. 1 is a circuit diagram of a prior art amplifier circuit.
Figure 2:
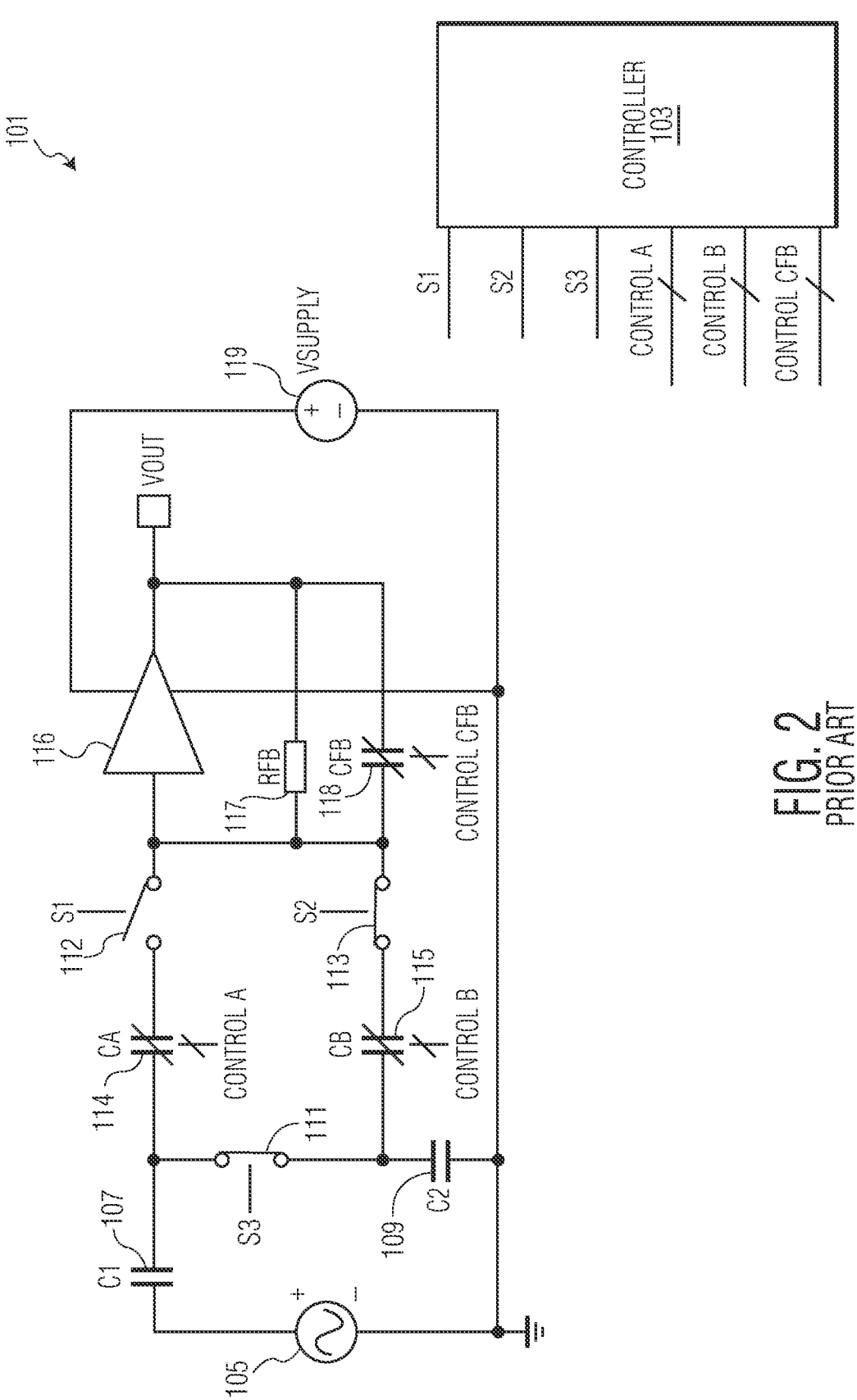
FIG. 2 is a circuit diagram of a prior art amplifier circuit.

FIGS. 1 and 2 are prior art circuit diagrams of an amplifier circuit 101 in an amplitude modulation (AM) radio receiver showing two different modes of operation. Amplifier circuit 101 receives an AM voltage signal from antenna 105 (represented in FIGS. 1 and 2 as a voltage source). Circuit 101 includes an input capacitor 107, a switch 111, and a divider capacitor 109. A programmable capacitor bank 114 is connected to one terminal of switch 111 and a programmable capacitor bank 115 is connected to the other terminal of switch 111. Switches 112 and 113 are used to selectively implement bank 114 and bank 115, respectively, by providing a signal path to the input of amplifier 116. Circuit 101 includes a feedback resistor 117 and a feedback capacitor bank 118 that are each connected to the input and output of amplifier 116. The high side power supply rail of amplifier 116 is powered from a voltage supply (VSUPPLY 119) and the low side power supply rail is electrically connected to ground. Circuit 101 includes a controller 103 for providing the switch control signals S1, S2, and S3 for controlling switches 112, 113, and 111, respectively, and for providing control signals CONTROL A, CONTROL B, and CONTROL CFB for controlling the capacitances of programmable capacitor banks 114, 115, and 118, respectively.

FIG. 1 shows circuit 101 when switch 112 is closed and switch 111 and 113 is open such that the input signal is provided through capacitor 102 and though programmable capacitor bank 114 to amplifier 116. During this mode of operation, the capacitances of banks 114 and 118 are adjusted so that the output voltage of amplifier 116 is within a desired voltage range for further processing.

FIG. 2 shows circuit 101 with switch 112 open and switches 111 and 113 closed. In this configuration, capacitors 107 and 109 act as a capacitor voltage divider to reduce the voltage of the input signal to prevent voltage overload of amplifier circuit 101. In this mode of operation, the capacitances of bank 115 and bank 118 are controlled to control the gain of amplifier 116 within a specified voltage range.

Circuit 101 is placed in the configuration of FIG. 1 or FIG. 2, based on the voltage level of the output of amplifier 116 (VOUT) so as to keep the voltage of VOUT within a specified range. If receiving a weak input signal from antenna 105, the capacitor voltage divider is turned off because utilizing it may increase the equivalent input noise.

Because switch 111 is typically implemented with an N type FET, switch 111 has a nonlinear on-resistance when closed. This nonlinearity produces distortion products by creating unwanted components at linear combinations of the fundamental frequencies. A distortion voltage distributes over capacitors 107 and 109 in proportion to their capacitances. Therefore, with the configuration of FIG. 2, a distortion voltage can appear at both opposing terminals of switch 111, where the distortion appearing at one terminal has the opposite polarity of the distortion at the other terminal and where the magnitude of the distortion is dependent upon the capacitances of capacitors 107 and 109.

Figure 3:
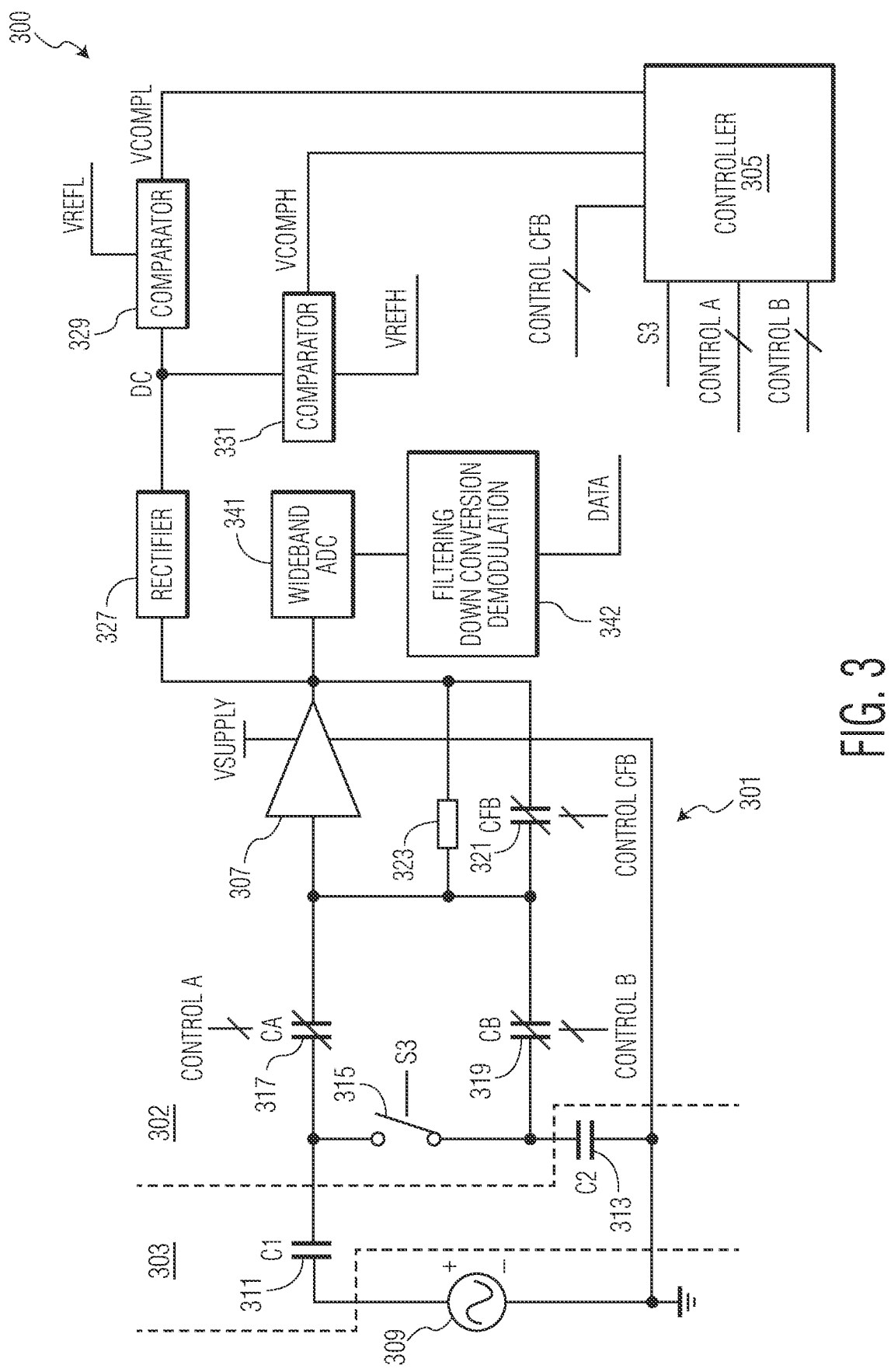
FIG. 3 is a circuit diagram of an AM radio receiver with an amplifier circuit according to one embodiment of the present invention.

FIG. 3 is a circuit diagram of an AM radio receiver 300 that includes an amplifier circuit 301 according to one embodiment of the present invention. Amplifier circuit 301 receives an AM voltage signal from antenna 309 (represented in FIG. 3 as a voltage source). In one embodiment, antenna is a dipole antenna, but may be other types of antennas such as a loop antenna, whip antenna, or another type of antenna that is integrated into the design of an automobile. In one embodiment, the output impedance of antenna 309 is 50 ohms, but may be of other impedances in other embodiments. In one embodiment, receiver 300 is designed to receive and process AM signals in the frequency range of 535 to 1705 kilohertz, but may process signals in other frequency ranges in other embodiments.

Circuit 301 includes an input capacitor 311 that receives the antenna signal at a first electrode, a switch 315 that includes a terminal electrically connected to the other electrode of input capacitor 311, and a divider capacitor 109 including one electrode electrically connected to ground and the other electrode electrically connected to a terminal of switch 315. A programmable capacitor bank 317 includes one terminal electrically connected to a terminal of switch 315 and to an electrode of capacitor 311. The other terminal of bank 317 is electrically connected to the input of amplifier 307. A programmable capacitor bank 319 includes one terminal electrically connected to the other terminal of switch 315 and to an electrode of divider capacitor 313. The other terminal of bank 319 is electrically connected to the input of amplifier 307. Circuit 301 includes a feedback resistor 323 and a feedback capacitor bank 321 that are each electrically connected between the input and output of amplifier 307. The high side power supply rail of amplifier 307 is powered from a voltage supply (VSUPPLY) and the low side power supply rail of amplifier 307 is connected to ground. In one embodiment, amplifier 307 is differential amplifier where the inverting input of amplifier 307 is electrically connected to a terminal of bank 317 and to a terminal of bank 319, and the non inverting input is electrically connected to ground. Controller 305 provides switch control signal S3 for controlling the conductivity of switch 315 and provides multi signal line control signals CONTROL A, CONTROL B, and CONTROL CFB for controlling the capacitances of programmable capacitor banks 317, 319, and 321, respectively. In one embodiment, controller 305 is implemented with a processor circuit (not shown), but in other embodiments, may be implemented with logic circuitry or with a combination thereof.

Receiver 300 includes a wideband analog to digital converter (ADC) 341 that converts the modulated analog output of amplifier 307 to a digital signal. The digital output of ADC 341 is then provided to circuitry 342 that filters the digital output, down converts the signal from the modulated frequency of the digital output, and demodulates the down converted signal to produce the transmitted information that can be played on a speaker (not shown). Other types of receivers may process the amplified signal in other ways and/or with other types of circuitry.

Receiver 300 includes a rectifier 327 for providing a rectified DC voltage of the alternating current (AC) output of amplifier 307. The DC voltage is supplied to both a low voltage comparator 329 and a high voltage comparator 331. Low voltage comparator 329 compares the output of rectifier 327 with reference voltage VREFL and asserts the VCOMPL signal if the output is below reference voltage VREFL. High voltage comparator 331 compares the output of rectifier 327 with reference voltage VREFH and asserts the VCOMPH signal if the output of rectifier 327 is above reference voltage VREFH.

Controller 305 uses the VCOMPH and VCOMPL signals to control the gain of amplifier 307 by adjusting the capacitance values of banks 317, 319, and 321 and to control switch 315 so as to keep the output of amplifier 307 in a voltage range as defined by voltage references VREFL and VREFH. In some embodiments, controller 305 provides the amplifier gain status to circuitry 342 for processing the digital information. In other embodiments, controller 305 may receive voltage information from ADC 341 for controlling the gain of amplifier 307.

Controller 305 controls circuit 301 to operate in two different modes. In a high gain mode, switch 315 is open to where the input signal from antenna 309 passes through input capacitor 331 and through capacitor bank 317 to the input of amplifier 307. In the high gain mode, controller 305 adjusts the capacitance of bank 317 and the capacitance of bank 321 to adjust the gain of amplifier 307 to keep the voltage of the output of rectifier 327 between VREFL and VREFH. In one embodiment, the gain of amplifier 307 (H) in the high gain mode is given by:

$$H = \frac{C_1 \cdot C_A}{C_{FB}(C_1 + C_A)} \qquad \text{EQ 1}$$

Where CFB is the capacitance of bank 321, CA is the capacitance of bank 317, and C1 is the capacitance of input capacitor 311.

When operating in the high gain mode, if the voltage of the output of rectifier 327 rises above VREFH, the capacitances of bank 317 and bank 321 are adjusted to decrease the gain to lower the output voltage of amplifier 307. If the antenna voltage keeps rising, controller 305 continues to lower the gain of amplifier 307 until it reaches a minimum gain.

If the antenna voltage continues to rise while at the minimum gain in the high gain mode, circuit 301 transitions to a low gain mode of operation where controller 305 closes switch 315 such that input capacitor 311 and divider capacitor 313 serve as a capacitor voltage divider to attenuate the signal being provided to the input of amplifier 307. In the low gain mode of operation, controller 305 controls the capacitances of bank 317, bank 319, and bank 321 to adjust the gain of amplifier 307 to keep the output voltage of rectifier 327 between VREFL and VREFH.

Because switch 315 may be implemented with a FET such as an NFET, switch 315 may exhibit a nonlinear on-resistance. This nonlinear on-resistance may generate voltage disturbances at each terminal of switch 315 where the voltage disturbances at the opposing terminals have opposite polarities.

Accordingly, in the low gain mode of operation, both programmable capacitor banks 317 and 319 are each controlled to provide a capacitance that is used to both control the gain of amplifier 307 but also to counteract the voltage disturbances on each terminal of switch 315.

In one embodiment, to counteract the disturbances of each at each terminal of switch 315, the capacitance of bank 317 and the capacitance of bank 319 are selected so as to feasibly maintain the ratio of:

$$\frac{C_A}{C_B} = \frac{C_1}{C_2} \qquad \text{Equation 2}$$

Where CA is the capacitance of bank 317, CB is the capacitance of bank 319, C1 is the capacitance of input capacitor 311 and C2 is the capacitance of divider capacitor 313. As used herein, feasibly maintain the ratio of $C_1/C_2$ means that the ratio $C_A/C_B$ of the capacitances of the capacitor banks 317 and 319 are programmed to be as close to the ratio of $C_1/C_2$ as possible given the configurations of the capacitor banks. For example, where the capacitor banks 317 and 319 are configured to provide programmable quantized capacitance levels, the ratio of $C_A/C_B$ may not exactly match $C_1/C_2$. By feasibly maintaining the above ratio, the weighted sums of the voltages of banks 317 and 319 cancel out the disturbances at the switch terminals that are due to the nonlinearity of the on-resistance of the switch 315.

In order to adjust the gain of amplifier 307 in the low gain mode of operation, the total gain of $C_A + C_B$ is adjusted with respect to the capacitance of feedback bank 321 wherein the gain of amplifier 307 (H) is given by:

$$H = \frac{C_1}{C_1 + C_2 + C_A + C_B} \cdot \frac{C_A + C_B}{C_{FB}} \approx \frac{C_1}{C_1 + C_2} \cdot \frac{C_A + C_B}{C_{FB}} \qquad \text{Equation 3}$$

In one embodiment, antenna 309 is implemented in a car (e.g., embedded in a rear window). Capacitors 311 and 313 are discrete devices that are mounted on a circuit board 303 and are each of a fixed capacitance value. The remaining circuitry of receiver 300 shown in FIG. 1 is implemented in an integrated circuit 302 mounted to the circuit board. However, a receiver may be implemented differently in other embodiments. For example, capacitors 311 and 313 could be implemented in an integrated circuit with the remaining portion of amplifier circuit 301. Also in other embodiments, the feedback capacitor (e.g., bank 321) could be implemented with a fixed capacitor. Also in other embodiments, switch 315 may be implemented with other types of switches such as a PFET or passgate. Furthermore, some of the functions of circuitry 342 may be implemented with analog circuitry.

In one embodiment, input capacitor 311 is 1 nF, divider capacitor 313 is 12 nF, and feedback capacitor bank 321 is 10 pF. However, these capacitances may be of other values in other embodiments. In one embodiment, the programmable capacitor banks 317, 319, and 321 are configured to adjust of the gain of amplifier 307 at 3 dB intervals. However, the gain of amplifier 307 may be adjusted at other intervals in other embodiments.

Figure 4:
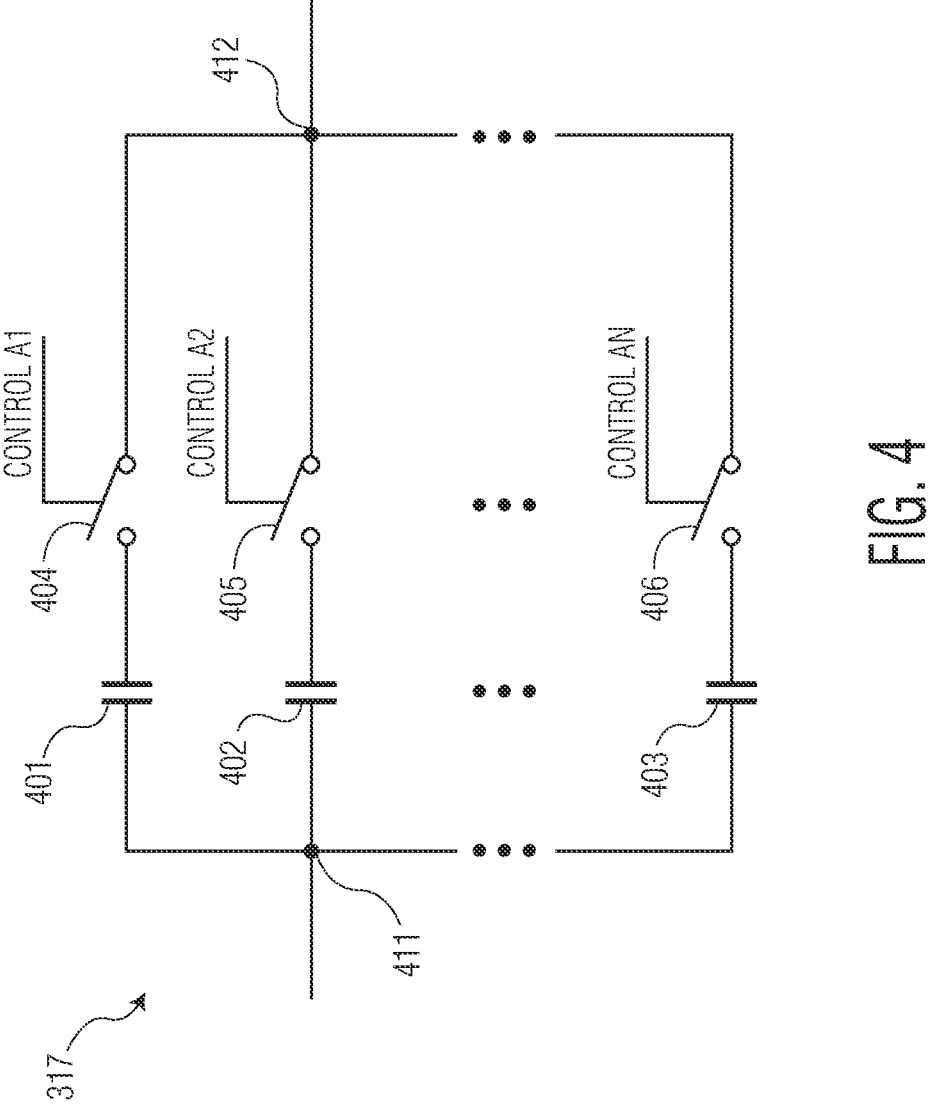
FIG. 4 is a circuit diagram of a programmable capacitor bank according to one embodiment of the present invention.

FIG. 4 is a circuit diagram of programmable capacitor bank 317 according to one embodiment. In the embodiment of FIG. 4, bank 317 includes multiple capacitors with capacitors 401, 402, and 403 being shown. Each capacitor 401, 402, and 403 is selectively enabled by the closure of a corresponding switch 404, 405, and 406, respectively, as controlled by a signal CONTROL A1, CONTROL A2, and CONTROL AN, respectively, of multiline signal Control A provided by controller 305 (see FIG. 3). In one embodiment, switches 404-406 are implemented with NFETs, but may be implemented with other types of switches (e.g., PFETs, pass gates) in other embodiments. Bank terminal 411 is connected to a terminal of switch 315 and bank terminal 412 is connected to the input of amplifier 307. In one embodiment, each capacitor 401-403 of bank 317 is the same size. In other embodiments, capacitors 401-403 are of different sizes. Although FIG. 4 shows three capacitors, other embodiments may include more capacitors (e.g., 8, 10, 16 etc.). In one embodiment, bank 317 is capable of provide a capacitance that ranges from 0 pf to 320 pf based on the assertion of different combinations of the CONTROL A signals. However, a capacitor bank may provide other capacitance values in other embodiments.

Figure 5:
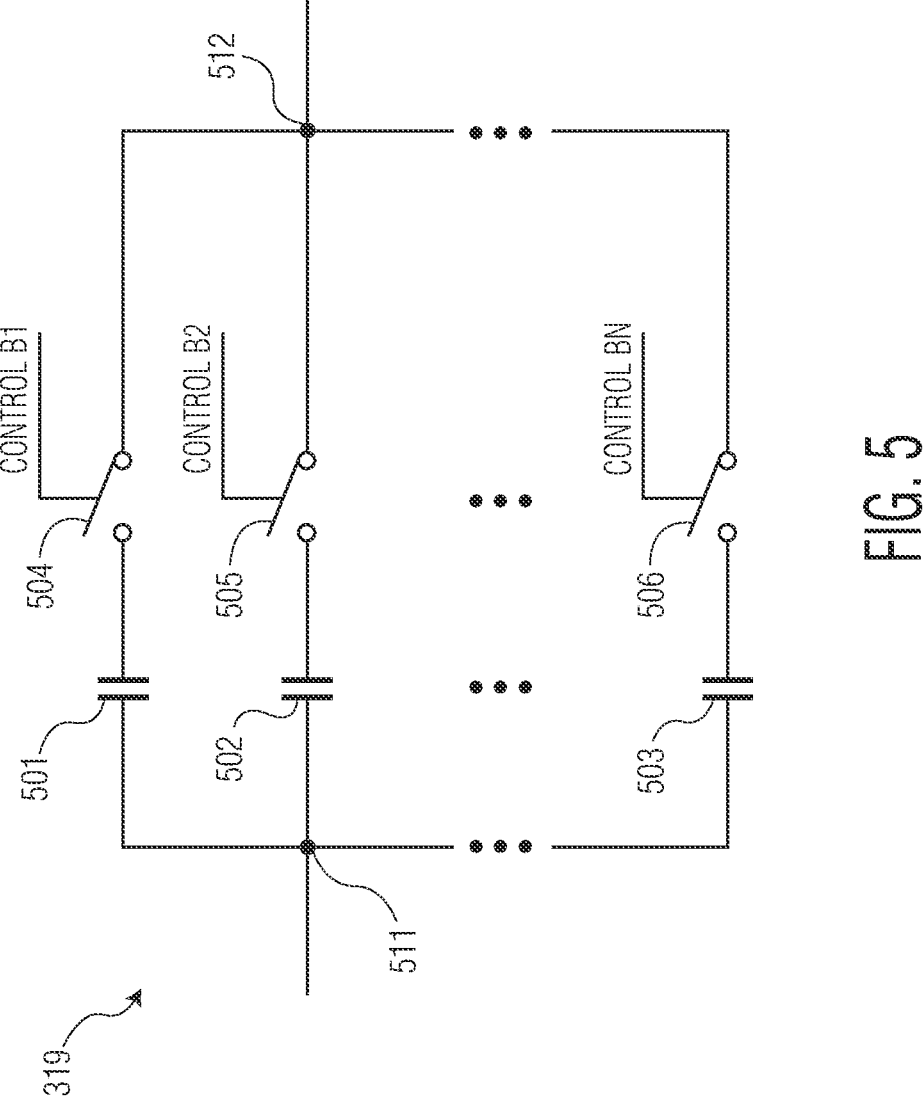
FIG. 5 is a circuit diagram of a programmable capacitor bank according to one embodiment of the present invention.

FIG. 5 is a circuit diagram of programmable capacitor bank 319 according to one embodiment. In the embodiment of FIG. 5, bank 319 includes multiple capacitors with capacitors 501, 502, and 503 being shown. Each capacitor 501, 502, and 503 is selectively enabled by the closure of a corresponding switch 504, 505, and 506, respectively, as controlled by a signal CONTROL B1, CONTROL B2 and CONTROL BN, respectively, of multiline signal Control B provided by controller 305 (see FIG. 3). In one embodiment, switches 504-506 are implemented with NFETs, but may be implemented with other types of switches (e.g., PFETs, pass gates) in other embodiments. Bank terminal 511 is connected to a terminal of switch 315 and bank terminal 512 is connected to the input of amplifier 307. In one embodiment, each capacitor 501-503 of a bank is the same size. In other embodiments, capacitors 501-503 are of different sizes. Although FIG. 5 shows three capacitors, other embodiments may include more capacitors (e.g., 8, 10, 16 etc.). In one embodiment, bank 319 is capable of provide a capacitance that ranges from 0 pf to 320 pf based on the assertion of different combinations of the CONTROL B signals. However, a capacitor bank may provide other capacitance values in other embodiments. When in the high gain mode of operation, all switches 504-506 are open such that there is no signal path from terminal 511 to terminal 512 through bank 319 and no capacitors of bank 319 are enabled.

Figure 6:
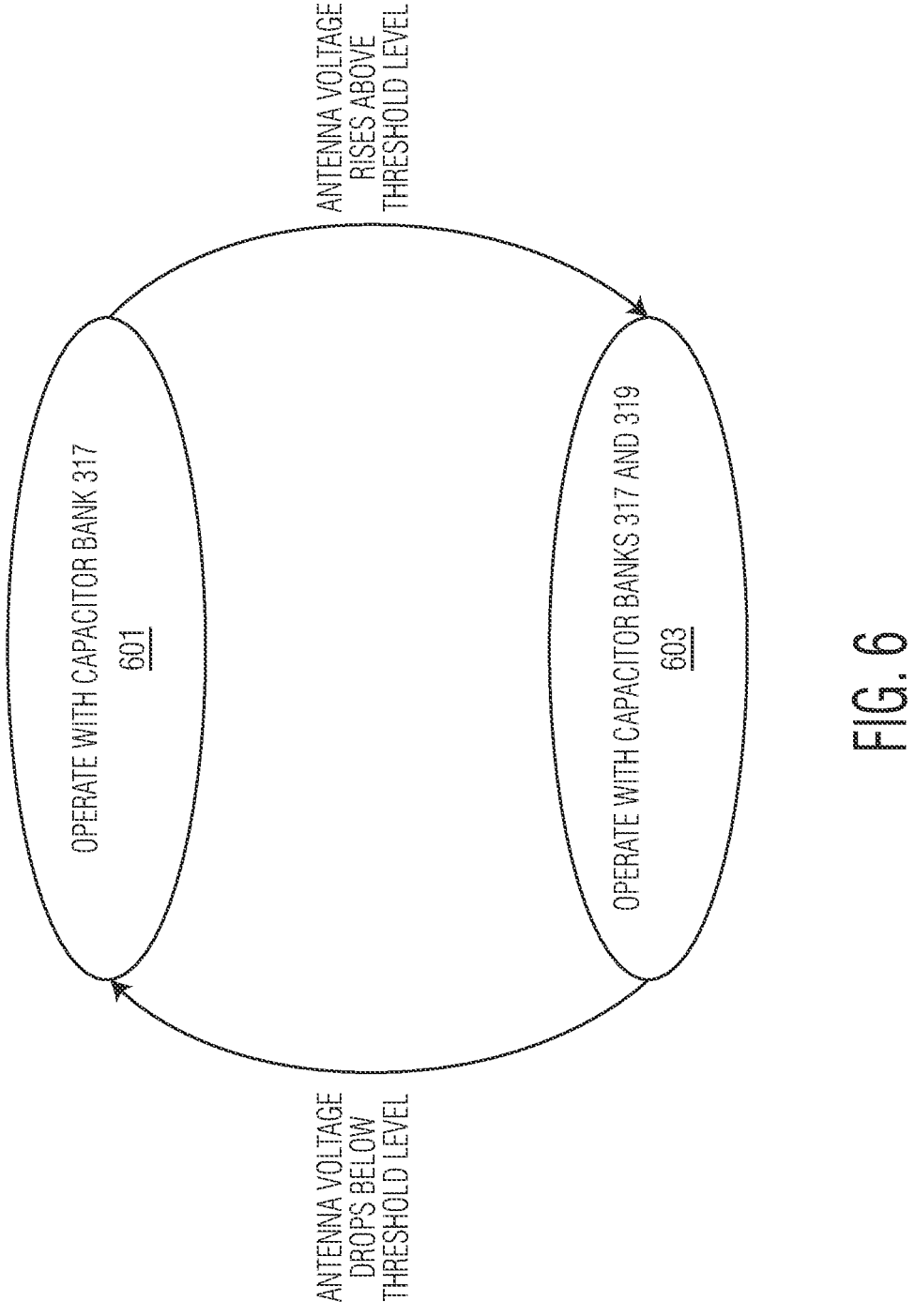
FIG. 6 is a state diagram showing the operation of an amplifier circuit according to one embodiment of the present invention.

FIG. 6 shows a state diagram of the operation of circuit 301 according to one embodiment. When operating in a high gain mode (601), controller 305 adjusts the capacitance of bank 317 to control the gain of amplifier 307. When operating in the low gain mode 603, controller 305 adjusts the capacitance of banks 317 and 319 to control the gain of amplifier 307.

In one embodiment, circuit 301 transitions from the high gain operating mode 601 to the low gain operating mode 603 when the voltage of antenna 309 rises above a threshold voltage level. In one embodiment, the threshold voltage level corresponds to the output of rectifier 327 rising above VREFH when circuit 301 is set on the lowest amplifier gain in the high gain operating mode 601.

In another embodiment, circuit 301 transitions from the low gain operating mode 603 to the high gain operating mode 601 when the voltage of antenna 309 falls below a threshold voltage level. In one embodiment, the threshold voltage level corresponds to the output of rectifier 327 falling below VREFL when circuit 301 is set on the highest amplifier gain of the low gain operating mode 603. In some embodiments, circuit 301 may include a hysteresis feature where the threshold voltage in transitioning from mode 601 to mode 603 is higher than the threshold antenna voltage in transitioning from mode 603 to mode 601.

In one embodiment, providing an amplifier circuit that includes two programmable capacitor banks that are coupled to opposing terminals of a switch may provide for an amplifier circuit that can implement a capacitor voltage divider with a switch while minimizing the voltage distortion due to the switch. Accordingly, such an amplifier circuit can be utilized over a wider range of input voltages.

Although amplifier circuit 301 is shown as receiving an antenna voltage from antenna 309 in FIG. 3, circuit 301 may be used to amply other signals from other devices in other embodiments.

Features shown or described with respect to one embodiment described herein may implemented with other embodiments described herein.

In one embodiment, a circuit includes an input node, an input capacitor including a first electrode electrically coupled to the input node, an amplifier, a first programmable capacitor bank including a first terminal electrically coupled to a second electrode of the input capacitor and a second terminal electrically coupled to an input of the amplifier, a switch including a first terminal couple to the second electrode of the input capacitor and to the first terminal of the first programmable capacitor bank, a second programmable capacitor bank including a first terminal electrically coupled to a second terminal of the switch and including a second terminal electrically coupled to the input of the amplifier, a divider capacitor including a first electrode electrically coupled to the second terminal of the switch and electrically coupled to the first terminal of the second programmable capacitor bank, and a controller including an output to control the conductivity of the switch. During a first mode of operation, the switch is open such that there is no conductive path between its first terminal and its second terminal through the switch and the input capacitor and the divider capacitor are not configured as a capacitor voltage divider. During the second mode of operation, the switch is closed such that there is a conductive path between its first terminal and its second terminal through the switch and the input capacitor and the divider capacitor are configured as a capacitor voltage divider. During the first mode of operation, a capacitance provided by the first programmable capacitor bank but not a capacitance provided by the second programmable capacitor bank is adjusted to control the gain of the amplifier. During the second mode of operation, the capacitance provided by the first programmable capacitor bank and the capacitance provided by the second programmable capacitor bank are each adjusted to control the gain of the amplifier.

In another embodiment, a method for amplifying a signal includes in a first mode of operation, providing an input signal from a first node, through an input capacitor, through a first programmable capacitor bank, and to an input of an amplifier. During the first mode of operation, a switch is open such that there is no signal path from the input capacitor to a divider capacitor through the switch, and during the first mode of operation, a capacitance of the first programmable capacitor bank is adjusted to control a gain of the amplifier but a capacitance of a second programmable capacitor bank is not adjusted to control the gain of the amplifier. In a second mode of operation, the input signal is provided from the first node through the input capacitor where the switch is closed to provide a signal path through the switch from an electrode of the input capacitor to the divider capacitor where the input capacitor and the divider capacitor are configured as a capacitor voltage divider such a signal at a node between the input capacitor and divider capacitor is provided through the first programmable capacitor bank and through the second programmable capacitor bank to the input of the amplifier. During the first mode of operation, the capacitance of the first programmable capacitor bank and the capacitance of the second programmable capacitor bank are adjusted to control the gain of the amplifier.

In another embodiment, a circuit includes a switch including a first terminal and a second terminal, an amplifier, and a first programmable capacitor bank including a first terminal electrically coupled to the first terminal of the switch and including a second terminal electrically coupled to an input of the amplifier. The circuit includes a second programmable capacitor bank including a first terminal electrically coupled to the second terminal of the switch and including a second terminal electrically coupled to the input of the amplifier. The circuit includes a controller including an output to control the conductivity of the switch. During a first mode of operation, the switch is open such that there is no conductive path between its first terminal and its second terminal through the switch. During a second mode of operation, the switch is closed such that there is a conductive path between its first terminal and its second terminal through the switch. During the first mode of operation, a capacitance provided by the first programmable capacitor bank but not a capacitance provided by the second programmable capacitor bank is adjusted to control a gain of the amplifier. During the second mode of operation, the capacitance provided by the first programmable capacitor bank and the capacitance provided by the second programmable capacitor bank are each adjusted to control the gain of the amplifier.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
an input node;
an input capacitor including a first electrode electrically coupled to the input node;
an amplifier;
a first programmable capacitor bank including a first terminal electrically coupled to a second electrode of the input capacitor and a second terminal electrically coupled to an input of the amplifier;
a switch including a first terminal coupled to the second electrode of the input capacitor and to the first terminal of the first programmable capacitor bank;
a second programmable capacitor bank including a first terminal electrically coupled to a second terminal of the switch and including a second terminal electrically coupled to the input of the amplifier;
a divider capacitor including a first electrode electrically coupled to the second terminal of the switch and electrically coupled to the first terminal of the second programmable capacitor bank;
a controller including an output to control the conductivity of the switch, wherein during a first mode of operation, the switch is open such that there is no conductive path between the first terminal of the switch and the second terminal of the switch through the switch and the input capacitor and the divider capacitor are not configured as a capacitor voltage divider, wherein during the second mode of operation, the switch is closed such that there is a conductive path between the first terminal of the switch and the second terminal of the switch through the switch and the input capacitor and the divider capacitor are configured as a capacitor voltage divider;
wherein during the first mode of operation, a capacitance provided by the first programmable capacitor bank but not a capacitance provided by the second programmable capacitor bank is adjusted to control a gain of the amplifier, wherein during the second mode of operation, the capacitance provided by the first programmable capacitor bank and the capacitance provided by the second programmable capacitor bank are each adjusted to control the gain of the amplifier.

2. The circuit of claim 1 wherein during the first mode of operation, the capacitance provided by the first programmable capacitor bank but not the capacitance provided by the second programmable capacitor bank is adjusted to control the gain of the amplifier in response to a change in an output voltage of the amplifier, wherein during the second mode of operation, the capacitance provided by the first programmable capacitor bank and the capacitance provided by the second programmable capacitor bank are each adjusted to control the gain of the amplifier in response to a change in an output voltage of the amplifier.

3. The circuit of claim 1 wherein the second programmable capacitor bank includes a plurality of switchable capacitors and a plurality of switches each for selectively enabling a capacitor of the plurality of switchable capacitors, wherein during the first mode of operation, all switches of the plurality of switches are open such that no capacitor of the plurality of switchable capacitors is enabled.

4. The circuit of claim 1 wherein during the second mode of operation, the capacitance of the first programmable capacitor bank and the capacitance of the second programmable capacitor bank are adjusted to adjust a total capacitance of the capacitance of the first programmable capacitor bank and the capacitance of the second programmable capacitor bank to control the gain of the amplifier and to feasibly maintain the ratio of the capacitance of the first programmable capacitor bank to the capacitance of the second programmable capacitor bank.

5. The circuit of claim 1 wherein during the second mode of operation, the capacitance of the first programmable capacitor bank and the capacitance of the second programmable capacitor bank are selected such that the ratio of the capacitance of the first programmable capacitor bank to the capacitance of the second programmable capacitor bank is feasibly maintained to the ratio of a capacitance of the input capacitor to a capacitance of the divider capacitor.

6. The circuit of claim 1 further comprising:

an antenna, the input node is electrically coupled to the antenna to receive a voltage of the antenna during the first mode of operation and during the second mode of operation.

7. The circuit of claim 6 wherein the antenna is configured to receive an amplitude modulated (AM) radio signal.

8. The circuit of claim 1 further comprising:

a programmable feedback capacitor bank having a first terminal electrically coupled to the input of the amplifier and a second terminal electrically coupled to the output of the amplifier;

wherein during the first mode of operation and during the second mode of operation, a capacitance provided by the programmable feedback capacitor bank is adjusted to control the gain of the amplifier.

9. The circuit of claim 1 wherein an output signal of the amplifier is characterized as an alternating current (AC) signal.

10. A method for amplifying a signal comprising:

in a first mode of operation, providing an input signal from a first node, through an input capacitor, through a first programmable capacitor bank, and to an input of an amplifier, wherein during the first mode of operation, a switch is open such that there is no signal path from the input capacitor to a divider capacitor through the switch, wherein during the first mode of operation, a capacitance of the first programmable capacitor bank is adjusted to control a gain of the amplifier but a capacitance of a second programmable capacitor bank is not adjusted to control the gain of the amplifier;

in a second mode of operation, the input signal is provided from the first node through the input capacitor where the switch is closed to provide a signal path through the switch from an electrode of the input capacitor to the divider capacitor where the input capacitor and divider capacitor are configured as a capacitor voltage divider such a signal at a node between the input capacitor and divider capacitor is provided through the first programmable capacitor bank and through the second programmable capacitor bank to the input of the amplifier, wherein during the second mode of operation, the capacitance of the first programmable capacitor bank and the capacitance of the second programmable capacitor bank are adjusted to control the gain of the amplifier.

11. The method of claim 10 wherein during the first mode of operation, the capacitance provided by the first programmable capacitor bank but not the capacitance provided by the second programmable capacitor bank is adjusted to control the gain of the amplifier in response to a change in an output voltage of the amplifier, wherein during the second mode of operation, the capacitance provided by the first programmable capacitor bank and the capacitance provided by the second programmable capacitor bank are each adjusted to control the gain of the amplifier in response to a change in an output voltage of the amplifier.

12. The method of claim 10 wherein during the second mode of operation, the capacitance of the first programmable capacitor bank and the capacitance of the second programmable capacitor bank are adjusted to adjust a total capacitance of the capacitance of the first programmable capacitor bank and the capacitance of the second programmable capacitor bank to control the gain of the amplifier and to feasibly maintain the ratio of the capacitance of the first programmable capacitor bank to the capacitance of the second programmable capacitor bank.

13. The method of claim 10 wherein during the second mode of operation, the capacitance of the first programmable capacitor bank and the capacitance of the second programmable capacitor bank are selected such that the ratio of the capacitance of the first programmable capacitor bank to the capacitance of the second programmable capacitor bank is feasibly maintained to the ratio of a capacitance of the input capacitor to a capacitance of the divider capacitor.

14. The method of claim 10 wherein the input signal is produced by an antenna.

15. The method of claim 14 wherein the input signal is an amplitude modulated (AM) signal.

16. The method of claim 10 wherein during the first mode of operation and during the second mode of operation, a capacitance provided by a feedback programmable capacitor bank is adjusted to control the gain of the amplifier, the feedback programmable capacitor bank including a first terminal electrically coupled to the input of the amplifier and a second terminal electrically coupled to an output of the amplifier.

17. A circuit comprising:

a switch including a first terminal and a second terminal;

an amplifier;

a first programmable capacitor bank including a first terminal electrically coupled to the first terminal of the switch and including a second terminal electrically coupled to an input of the amplifier;

a second programmable capacitor bank including a first terminal electrically coupled to the second terminal of the switch and including a second terminal electrically coupled to the input of the amplifier;

a controller including an output to control the conductivity of the switch, wherein during a first mode of operation, the switch is open such that there is no conductive path between the first terminal of the switch and the second terminal of the switch through the switch, wherein during a second mode of operation, the switch is closed such that there is a conductive path between the first terminal of the switch and the second terminal of the switch through the switch;

wherein during the first mode of operation, a capacitance provided by the first programmable capacitor bank but not a capacitance provided by the second programmable capacitor bank is adjusted to control a gain of the amplifier, wherein during the second mode of operation, the capacitance provided by the first programmable capacitor bank and the capacitance provided by the second programmable capacitor bank are each adjusted to control the gain of the amplifier.

18. The circuit of claim 17 wherein during the first mode of operation, the capacitance provided by the first programmable capacitor bank but not the capacitance provided by the second programmable capacitor bank is adjusted to control the gain of the amplifier in response to a change in an output voltage of the amplifier, wherein during the second mode of operation, the capacitance provided by the first programmable capacitor bank and the capacitance provided by the second programmable capacitor bank are each adjusted to control the gain of the amplifier in response to a change in an output voltage of the amplifier.

19. The circuit of claim 17 wherein during the second mode of operation, the capacitance of the first programmable capacitor bank and the capacitance of the second programmable capacitor bank are adjusted to adjust a total capacitance of the capacitance of the first programmable capacitor bank and the capacitance of the second programmable capacitor bank to control the gain of the amplifier and to feasibly maintain the ratio of the capacitance of the first programmable capacitor bank to the capacitance of the second programmable capacitor bank.

20. The circuit of claim 17 wherein the second programmable capacitor bank includes a plurality of switchable capacitors and a plurality of switches each for selectively enabling a capacitor of the plurality of switchable capacitors, wherein during the first mode of operation, all switches of the plurality of switches are open such that no capacitor of the plurality of switchable capacitors is enabled.

\* \* \* \* \*